US007172952B2

United States Patent
Chung (10) Patent No.: US 7,172,952 B2
(45) Date of Patent: Feb. 6, 2007

(54) POLYSILICON CRYSTALLIZING METHOD, METHOD OF FABRICATING THIN FILM TRANSISTOR USING THE SAME, AND METHOD OF FABRICATING LIQUID CRYSTAL DISPLAY THEREOF

(75) Inventor: Se Jin Chung, Kyongsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/189,770

(22) Filed: Jul. 8, 2002

(65) Prior Publication Data
US 2003/0013281 A1 Jan. 16, 2003

(30) Foreign Application Priority Data
Jul. 11, 2001 (KR) ................. 2001-41668

(51) Int. Cl.
H01L 21/20 (2006.01)
(52) U.S. Cl. ...................... 438/486; 438/488
(58) Field of Classification Search ............. 438/486, 438/487, 488, 150, 166, 164, 162, 30, 511; 117/8
See application file for complete search history.

(56) References Cited

U.S. PATENT DOCUMENTS

| 4,385,937 | A | * | 5/1983 | Ohmura ................. 438/150 |
| 4,500,388 | A | * | 2/1985 | Ohmura et al. ............. 117/8 |
| 4,693,759 | A | * | 9/1987 | Noguchi et al. ............. 117/8 |
| 5,221,630 | A | * | 6/1993 | Koyama et al. ........... 438/302 |
| 5,234,843 | A | * | 8/1993 | Oyoshi et al. ............ 438/485 |
| 5,290,712 | A | * | 3/1994 | Sato et al. ............... 438/798 |
| 5,318,661 | A | * | 6/1994 | Kumomi .................... 117/8 |
| 5,336,335 | A | * | 8/1994 | Hall et al. ................ 136/258 |
| 5,381,032 | A | * | 1/1995 | Kokawa et al. .......... 257/412 |
| 5,403,756 | A | * | 4/1995 | Yoshinouchi et al. ..... 438/162 |
| 5,495,824 | A | * | 3/1996 | Yonehara et al. ........... 117/8 |
| 5,627,086 | A | * | 5/1997 | Noguchi .................. 438/162 |
| 5,681,759 | A | * | 10/1997 | Zhang .................... 438/162 |
| 5,736,438 | A | * | 4/1998 | Nishimura et al. ........ 438/166 |
| 5,753,544 | A | * | 5/1998 | Cho et al. ................ 438/166 |
| 5,830,784 | A | * | 11/1998 | Zhang et al. ............. 438/154 |
| 5,885,884 | A | * | 3/1999 | Jan et al. ................ 438/482 |
| 5,932,893 | A | * | 8/1999 | Miyanaga et al. ........... 257/66 |
| 5,970,368 | A | * | 10/1999 | Sasaki et al. ............ 438/487 |
| 6,017,781 | A | * | 1/2000 | Shimizu et al. .......... 438/158 |
| 6,249,327 | B1 | * | 6/2001 | Murade et al. ............. 349/43 |
| 6,338,987 | B1 | * | 1/2002 | Yi et al. ................. 438/150 |
| 6,383,899 | B1 | * | 5/2002 | Voutsas ................... 438/486 |

FOREIGN PATENT DOCUMENTS

| JP | 8-330602 | 12/1996 |
| JP | 9-186336 | 7/1997 |
| JP | 2002-368013 | 12/2002 |
| WO | WO 02/103806 A1 | 12/2002 |

* cited by examiner

*Primary Examiner*—Lex H. Malsawma
(74) *Attorney, Agent, or Firm*—McKenna Long & Aldridge LLP (57) ABSTRACT

A method of crystallizing polysilicon, a method of fabricating a thin film transistor using the same, and a method of fabricating a liquid crystal display thereof form a polysilicon layer having uniformly oriented crystalline grains with high quality. A polysilicon crystallizing method includes forming a polysilicon layer on a substrate, making grains of the polysilicon layer amorphous except a portion of the grains having specific orientation, and crystallizing the polysilicon layer using the grains having the specific orientation.

22 Claims, 5 Drawing Sheets

POLYSILICON CRYSTALLIZING METHOD, METHOD OF FABRICATING THIN FILM TRANSISTOR USING THE SAME, AND METHOD OF FABRICATING LIQUID CRYSTAL DISPLAY THEREOF

This application claims the benefit of the Korean Application No. P2001-41668, filed on Jul. 11, 2001, which is hereby incorporated by reference for all purposes as if fully set forth herein.

BACKGROUND OF THE INVENTION

1. Field of the Invention

The present invention relates to a liquid crystal display (LCD), and more particularly, to a method of crystallizing polysilicon, a method of fabricating a thin film transistor using the same, and a method of fabricating a liquid crystal display thereof to form a polysilicon layer having uniformly oriented crystalline grains with high quality.

2. Discussion of the Related Art

Generally, a liquid crystal display (hereinafter abbreviated LCD) for a video apparatus has a variety of uses for a thin film transistor such as a switching device. A semiconductor layer in a thin film transistor (hereinafter abbreviated TFT) is formed of an amorphous silicon layer. There are advantages in small-scaled TFT LCD fabrication, but disadvantages in fabrication of a large-sized TFT LCD due to low electron mobility.

Hence, many efforts have been made to provide a polysilicon TFT using a polysilicon layer having excellent electron mobility as a semiconductor layer. Such a polysilicon TFT can be easily applied to the fabrication of a large-sized TFT LCD and is very competitive in integration and cost since the polysilicon TFT can be integrated on a TFT array substrate together with a driver IC.

The polysilicon layer is formed by various methods such as polysilicon direct deposition, crystallization of amorphous silicon into polysilicon, and the like. Generally, the latter method is used so that an amorphous silicon layer formed on a substrate is changed onto a polysilicon layer by carrying out crystallization thereon.

The former methods include plasma enhanced chemical vapor deposition (PECVD) using $SiF_4/SiH_4/H_2$ mixed gas at deposition temperature below 400° C. and the like. Yet, PECVD has difficulty in controlling grain growth, whereby the growing direction becomes irregular so as to degrade surface characteristics of a polysilicon film.

The latter methods include solid phase crystallization (SPC) of heating amorphous silicon in furnace for crystallization; excimer laser annealing (ELA) of crystallizing a film by irradiating an excimer laser beam of a high-output pulse laser instantly to apply heat to the film; metal induced crystallization (MIC) of inducing crystallization on amorphous silicon on which metal is deposited selectively by applying an electric field thereto using the metal as a seed; field enhanced metal induced crystallization (FEMIC) developed from MIC, and the like.

ELA, in which strong energy of a short wavelength ($\lambda$=0.3 µm) as a pulse form is applied to a silicon layer about 300~800 Å thick so as to melt the layer. Fast crystallization and excellent crystalline properties are realized to improve electron mobility.

Specifically, the short wavelength of the excimer laser uses the energy concentration of laser beams, thereby enabling precise annealing locally in a short time without causing any thermal damage on a lower silicon layer.

Meanwhile, a grain size of a polysilicon layer formed by ELA can be controlled precisely by varying the thickness of an amorphous silicon layer, the density of ultraviolet (UV) ray irradiation generated from laser, and the temperature of a lower substrate.

Explained in the following drawings are a method of crystallizing polysilicon, a method of fabricating a thin film transistor using the same, and a method of fabricating a liquid crystal display thereof according to a related art.

Figure 1A:
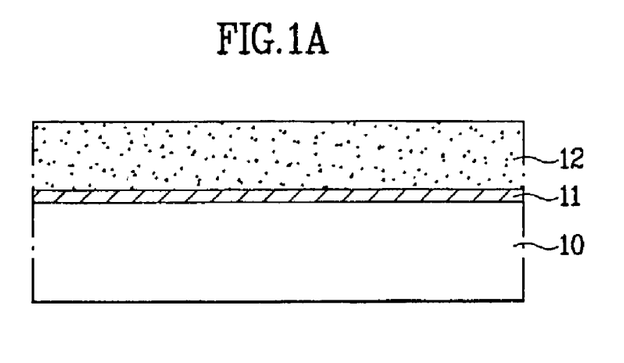
FIGS. 1A to 1C illustrate cross-sectional views of a process of crystallizing polysilicon according a related art.
Figure 1B:
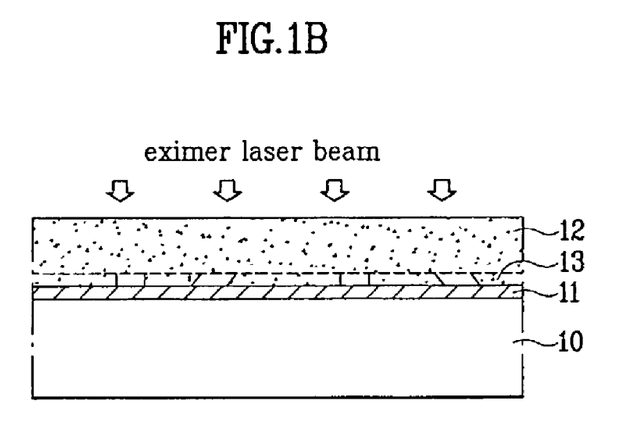
Figure 1C:
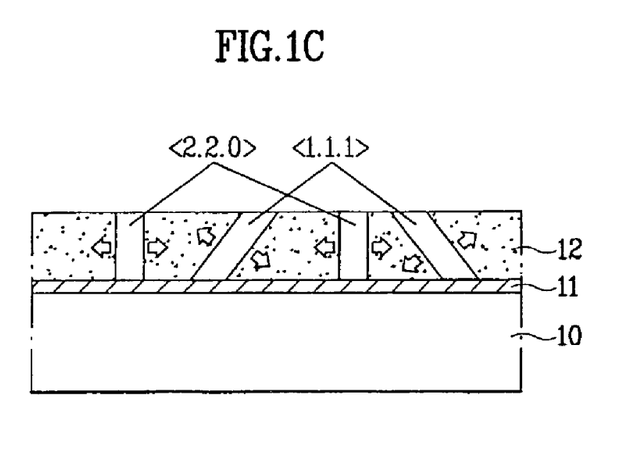

FIGS. 1A to 1C illustrate cross-sectional views of a process of crystallizing polysilicon according a related art.

Referring to FIG. 1A, silicon oxide ($SiO_2$) is deposited on a glass substrate 10 so as to form a buffer oxide layer 11. An amorphous silicon layer 12 is formed on the buffer oxide layer 11 by depositing amorphous silicon at 300~400° C. using one of PECVD, low pressure chemical vapor deposition (LPCVD), sputtering, and the like.

The buffer oxide layer 11 prevents particles in the substrate 10 from diffusing into the amorphous silicon layer 12 as well as preventing heat influx into the substrate 10 in a later crystallization process.

Referring to FIG. 1B, an excimer laser beam is irradiated on the amorphous silicon layer 12 to apply instant energy thereto so as to melt the amorphous silicon layer 12. In this case, a growth seed layer 13 which fails to melt exists in a lower portion of the amorphous silicon layer 12.

Thereafter, the melted amorphous silicon layer is solidified to grow crystals so as to be transformed into a polysilicon layer. Crystal growth is brought about centering around the growth seed layer 13. As shown in FIG. 1C, the growth seed layer 13 diffuses by the energy of the laser beam to move in a uniform direction so as to carry out crystallization.

Specifically, the preferred orientation of grain growth depends on the alignment of the growth seed layer. Generally, the crystalline growth orientation prevails mainly in the <111> orientation direction inclining to a substrate and is followed by orientation orders such as <220>, <311>, and the like so as to determine the growth directions of the grain.

Instead, in micro-polysilicon, grains having the <220> orientation direction vertical to a substrate prevail, grains having the <111> orientation direction occupy about 40%, and grains having the <311> orientation direction occupy about 10%.

Various growth orientations of grains exist in the polysilicon layer after laser annealing, whereby growing paths of the respective growing grains are interrupted. Thus, the grains fail to grow with ease. Moreover, grain boundary density increases so as to reduce electron mobility.

A polysilicon TFT according to a related art is fabricated as follows.

First, silicon oxide and amorphous silicon are deposited on a substrate in order so as to form buffer and amorphous silicon layers, respectively. Annealing using an excimer laser is carried out on the amorphous silicon layer so as to crystallize the amorphous silicon layer into a polysilicon layer.

The crystallized polysilicon layer is then patterned to form a semiconductor layer. Impurities are implanted in the semiconductor layer selectively so as to form source/drain regions. In this case, impurity implantation is carried out using a gate electrode insulated from the semiconductor layer as a mask, whereby a region, which is masked by the gate electrode so that the impurities fail to be implanted into the polysilicon layer, becomes a channel region.

Thereafter, source and drain electrodes are formed of metal material so as to be connected to the source and drain regions, respectively. In this case, the source and drain electrodes are insulated from the gate electrode by an insulating layer.

Thus, a polysilicon TFT having polysilicon as the semiconductor layer is completed.

Meanwhile, a liquid crystal display (LCD) having a polysilicon TFT includes a first substrate, a second substrate, and a liquid crystal layer provided between the first and second substrates. The first substrate includes gate and data lines arranged to cross with each other so as to define a pixel area, a polysilicon TFT, and a pixel electrode. The second substrate includes a color filter layer and a common electrode.

Unfortunately, the polysilicon crystallizing method, the polysilicon TFT fabrication method using the same, and the LCD fabrication method thereof according to the related art have the following disadvantages or problems.

Various growth orientations of the respective grains exist in the polysilicon layer crystallized through excimer laser annealing, whereby interference between the growing grains interrupts the grain growth. Also, the grain boundary density increases so as to reduce the mobility of electrons or holes.

Moreover, the liquid crystal display using a polysilicon layer as a channel layer fails to provide good reliability as a large-sized display device having high resolution and definition.

SUMMARY OF THE INVENTION

Accordingly, the present invention is directed to a method of crystallizing polysilicon, a method of fabricating a thin film transistor using the same, and a method of fabricating a liquid crystal display thereof that substantially obviates one or more problems due to limitations and disadvantages of the related art.

An advantage of the present invention is to provide a method of crystallizing polysilicon, a method of fabricating a thin film transistor using the same, and a method of fabricating a liquid crystal display thereof that increases electron mobility in polysilicon by forming a high-quality polysilicon layer having grains oriented uniformly and having increased size.

Another advantage of the present invention is to provide a method of fabricating a thin film transistor using a polysilicon layer of high quality and a method of fabricating a liquid crystal display thereof that provides excellent electrical characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described herein, a polysilicon crystallizing method according to the present invention includes forming a polysilicon layer on a substrate; making grains of the polysilicon layer amorphous except a portion of the grains having a specific orientation; and crystallizing the polysilicon layer using the grains having the specific orientation.

In another aspect of the present invention, a method of fabricating a polysilicon thin film transistor includes forming a polysilicon layer on a substrate; making grains of the polysilicon layer amorphous except a portion of the grains having a specific orientation; crystallizing the polysilicon layer using the grains having the specific orientation; patterning the polysilicon layer selectively and forming an insulating layer on an entire surface including the patterned polysilicon layer; forming a gate electrode on a predetermined area of the insulating layer over the polysilicon layer; and implanting impurities in the polysilicon layer using the gate electrode as a mask so as to form source/drain regions.

In a further aspect of the present invention, a method of fabricating a liquid crystal display includes forming a polysilicon layer on a substrate; making grains of the polysilicon layer amorphous except a portion of the grains having a specific orientation; crystallizing the polysilicon layer using the grains having the specific orientation; patterning the polysilicon layer selectively and forming an insulating layer on an entire surface including the patterned polysilicon layer; forming a gate electrode on a predetermined area of the insulating layer over the polysilicon layer; implanting impurities in the polysilicon layer using the gate electrode as a mask so as to form source/drain regions; forming source/drain electrodes connected to the source/drain regions, respectively; forming a pixel electrode connected to the drain electrode; and bonding the first substrate to a second substrate so as to confront each other and injecting liquid crystals in a space between the bonded first and second substrates.

Namely, the present invention is characterized in that silicon ion implantation is carried out in a direction vertical to the polysilicon layer to make the grains, which are aligned in other directions except the vertical direction, become amorphous so as to lead to the grain growth in the vertical direction only based on the principle that polysilicon deposited under proper deposition conditions becomes micropolysilicon containing a plurality of vertical directional grains. Therefore, the present invention attains large-sized grains as well as grain distribution aligned in a uniform direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 2A:
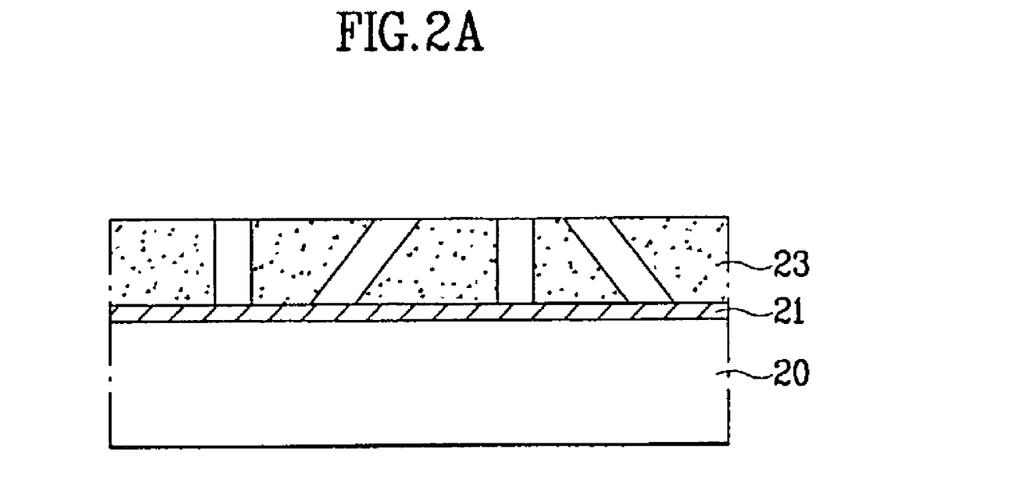
FIGS. 2A to 2D illustrate cross-sectional views of a process of crystallizing polysilicon according the present invention.
Figure 2B:
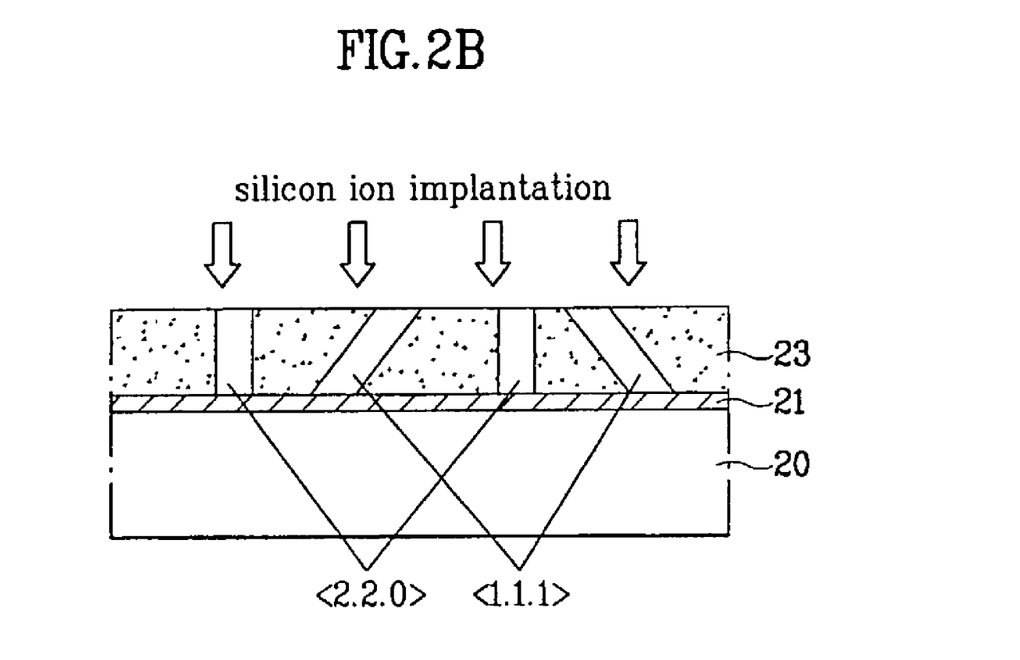
Figure 2C:
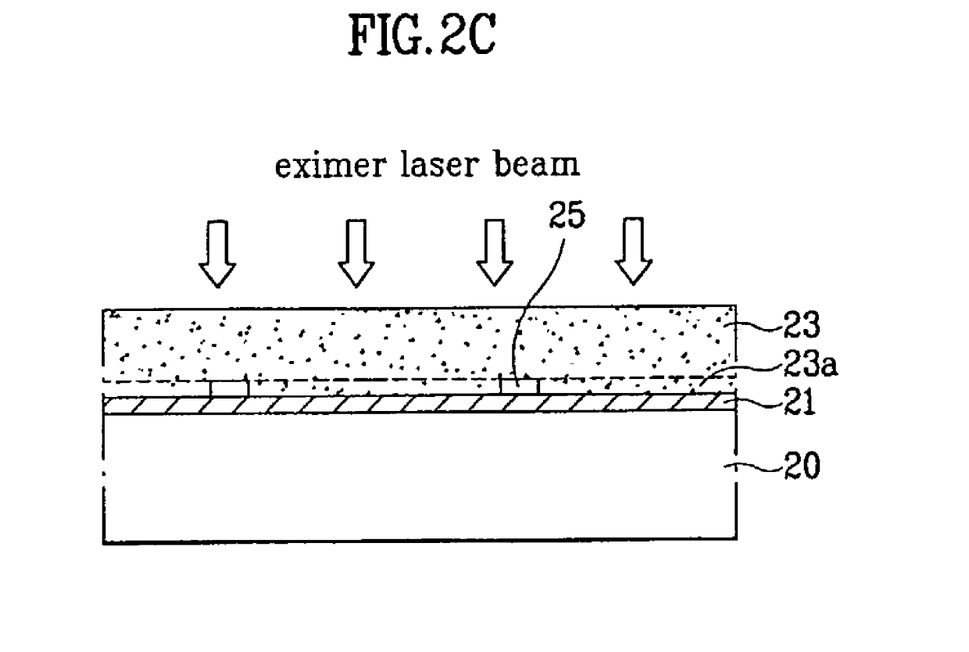
Figure 2D:
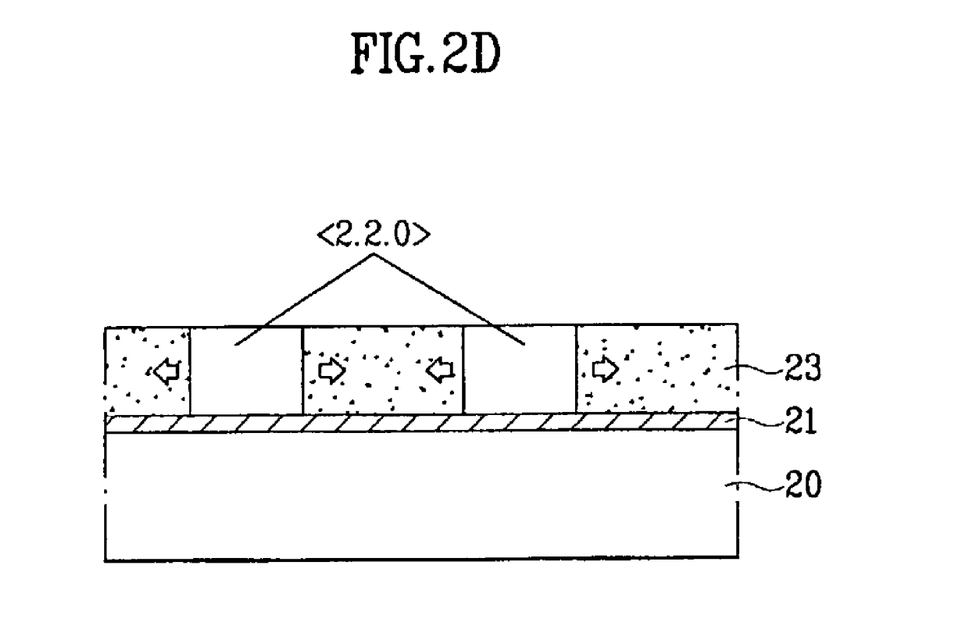
Figure 3:
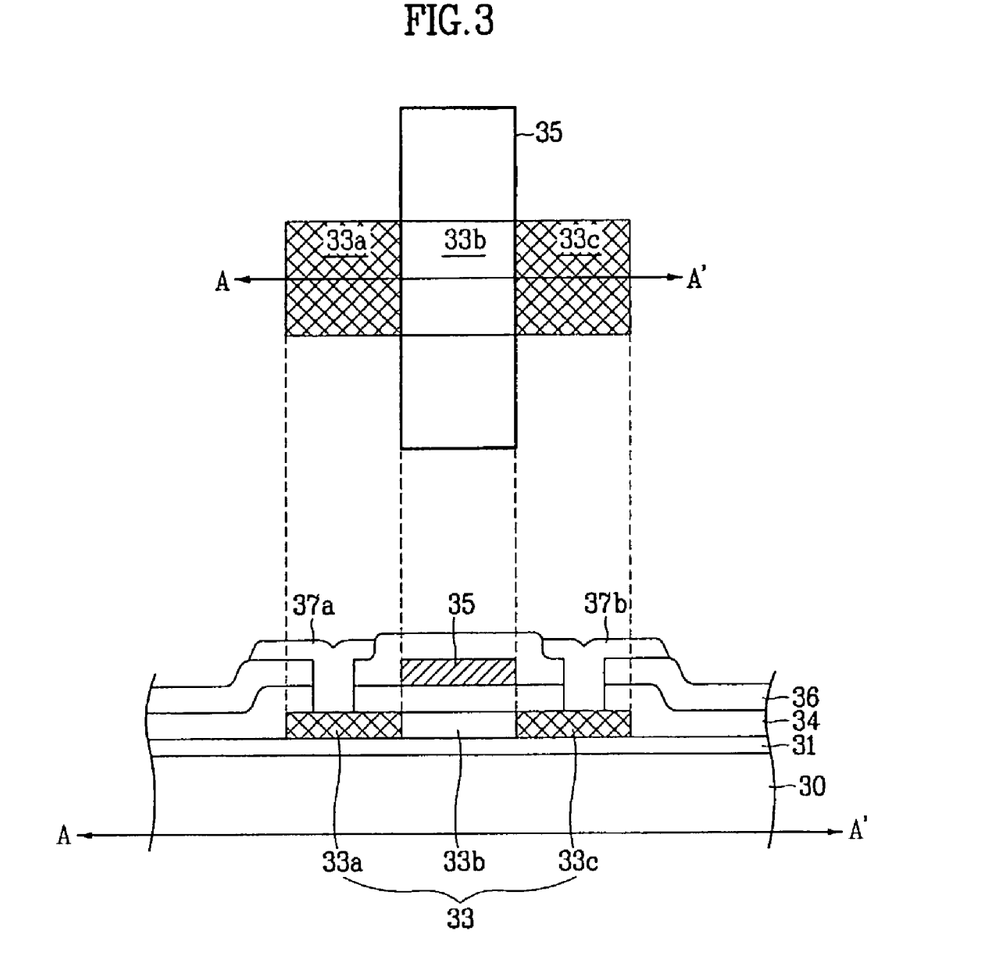
FIG. 3 illustrates a layout and a cross-sectional view of a polysilicon TFT according to the present invention.

FIGS. 2A to 2D illustrate cross-sectional views of a process of crystallizing polysilicon according the present invention FIG. 3 illustrates a layout and a cross-sectional view of a polysilicon TFT according to the present invention for explaining a fabrication method thereof.

Figure 4:
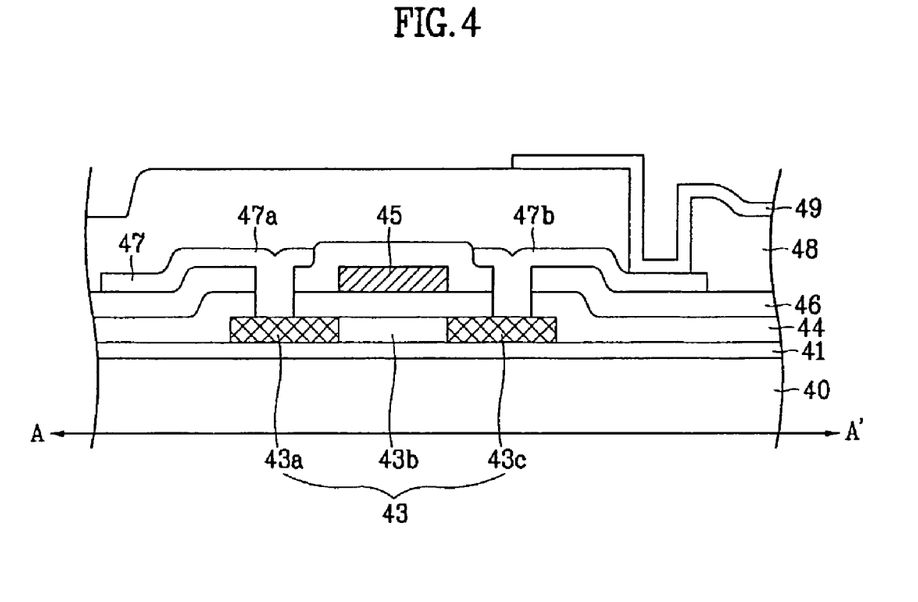
FIG. 4 illustrates a cross-sectional view of a LCD according to the present invention.

FIG. 4 illustrates a cross-sectional view of a LCD according to the present invention for explaining a fabrication method thereof.

Referring to FIG. 2A, a polysilicon layer is crystallized in the following manner. Silicon oxide ($SiO_x$) is deposited uniformly and thinly on an entire surface of a substrate 20 so as to form a buffer oxide layer 21. Polysilicon is deposited on the buffer oxide layer 21 by chemical vapor deposition (CVD) so as to form a polysilicon layer 23. In this case, a deposition condition is properly controlled so as to make the polysilicon layer 23 become a micro-polysilicon layer having grains of the <220> orientation direction.

Referring to FIG. 2B, silicon (Si) ion implantation is carried out on the polysilicon layer 23 in a vertical direction, whereby the other grains having other orientations such as <111> and the like, except <220>, become amorphous. In this case, the incident silicon ions with the <220> orientation direction can accelerate the alignment for the <220> orientation direction.

Referring to FIG. 2C, an excimer laser beam is irradiated on the polysilicon layer so as to melt a predetermined thickness of the polysilicon layer 23. The melted portion of the polysilicon layer 23 is then solidified so as to be crystallized.

When excimer laser annealing is carried out so as to re-crystallize the polysilicon layer 23, a growth seed layer 23a having the <220> orientation direction, which exists in a lower area of the polysilicon layer 23 which fails to be melted, leads to growth of grains 25.

Referring to FIG. 2D, the grains of the <220> orientation direction grow large so as to be aligned in a vertical direction only. Hence, a characteristic of electron mobility is improves.

FIG. 3 illustrates a layout and a cross-sectional view of a polysilicon TFT according to the present invention for explaining a fabrication method thereof.

First, silicon oxide ($SiO_2$) is deposited on an entire surface of a substrate 30 so as to form a buffer oxide layer 31. A micro-polysilicon layer having dominant grains of the <220> orientation direction is deposited on the buffer oxide layer 31 so as to grow.

Subsequently, ion implantation for injecting silicon ions in the polysilicon layer 33 is carried out, whereby grain boundaries of the <111> and <311> orientation directions except <220>, become amorphous.

Ultraviolet (UV) rays having a beam form generated from an excimer laser is instantly irradiated on the polysilicon layer 33 having a grain boundary of the <220> orientation direction only. Then, energy is concentrated on the micropolysilicon layer by the excimer laser beam so as to attain a temperature about 1400° C. which is sufficient for melting a polysilicon layer. The polysilicon layer is melted by this temperature. In this case, grains grow centering around a growth seed layer of the <220> orientation direction which fail to be melted. Therefore, a polysilicon layer 33 consisting of large grains distributed in a uniform direction is attained.

Thereafter, the crystallized polysilicon layer 33 is patterned so as to form a semiconductor layer 33. An inorganic insulating layer such as silicon nitride ($SiN_x$), silicon oxide ($SiO_x$) or the like is deposited on an entire surface including the semiconductor layer 33 so as to form a first insulating layer 34 for forming a gate insulating layer.

A metal material having low resistance such as Al, Al alloy or the like is deposited on an entire surface including the first insulating layer 34. The metal material is patterned by photolithography so as to form a gate electrode 35 at a predetermined portion over the semiconductor layer 33.

Impurity ion implantation is carried out on the semiconductor layer 33 using the gate electrode 35 as a mask so as to form source/drain regions 33a/33c. In this case, the rest of the semiconductor layer 35 masked by the gate electrode 35 fails to be implanted so as to become a channel region 33b.

An inorganic insulating layer is deposited on an entire surface including the gate electrode 35 so as to form a second insulating layer 36 for forming an insulating interlayer. Portions of the second and first insulating layers 36 and 34 are selectively removed so as to form contact holes exposing predetermined portions of the source/drain regions 33a/33c, respectively.

Finally, metal material of low resistance such as Al, Al alloy or the like is deposited on the second insulating layer 36 so as to bury the contact holes. The metal material is patterned by photolithography so as to form source and drain electrodes 37a and 37b connected to the source/drain regions 33a/33b through the contact holes, respectively.

Thus, a polysilicon thin film transistor using polysilicon having high mobility as a channel area is completed. Specifically, the polysilicon according to the present invention has uniform alignment and large-sized grains so as to reduce the probability that electrons or holes are trapped by the grain boundaries. Hence, a mobility characteristic of a device is greatly increased.

FIG. 4 illustrates a cross-sectional view of a LCD according to the present invention for explaining a fabrication method thereof.

First, a buffer oxide layer 41 is formed on an entire surface of a first substrate 40 using silicon oxide. Micro-polysilicon having a dominant <220> orientation direction is deposited to grow on the buffer oxide layer 41.

Subsequently, self-ion implantation is carried out on the polysilicon layer 43 so as to implant silicon ions in a vertical direction. Hence, grains of <220> as a vertical direction are strengthened, but the rest of the grains become amorphous.

Annealing is then carried out on the polysilicon layer 42 having the grain boundaries of the <220> orientation direction only using an excimer laser so as to melt to re-crystallize the amorphous silicon layer. In this case, crystals are formed to grow from a growth seed layer of the <220> orientation direction existing in a lower portion of the polysilicon layer.

Therefore, grains having uniform alignment are formed to grow large without obstacles interrupting the crystal growth.

After completion of the crystallization, the re-crystallized polysilicon layer 43 is patterned by photolithography so as to form a semiconductor layer 43 having an isolated island shape.

Subsequently, silicon nitride is coated on an entire surface including the semiconductor layer 43 so as to form a gate insulating layer 44. Metal of low resistance such as aluminum (Al), molybdenum (Mo), copper (Cu), or the like is deposited on the gate insulating layer 44. The deposited metal is patterned by photolithography so as to form a plurality of gate lines (not shown in the drawing) and a gate electrode 45 diverging from the corresponding gate line to be located at a predetermined portion of the semiconductor layer 43.

Impurity ion implantations are then carried out on the semiconductor layer 43 using the gate electrode 45 as a mask so as to form source/drain and channel regions 43a/43c and 43b.

Thereafter, silicon nitride is coated on an entire surface including the gate electrode 45 so as to form an insulating interlayer 46. Portions of the insulating interlayer 46 and gate insulating layer 44 are selectively removed so as to form contact holes exposing the source/drain regions 43a/43c, respectively.

Subsequently, metal of low resistance such as aluminum (Al), molybdenum (Mo), copper (Cu), chromium (Cr) or the like is deposited on the insulating interlayer 46 so as to bury the contact holes. The deposited metal is patterned by photolithography so as to form a data line 47 crossing with the gate lines and source/drain electrodes 47a/47b connected to the source/drain regions 43a/43c through the contact holes, respectively.

In this case, the data line 47 and gate line crossing with each other defines a pixel, and the semiconductor layer 43, gate electrode 45a, and source/drain electrodes 47a/47b at the intersection between the data and gate lines constitute a polysilicon thin film transistor.

Thereafter, an organic insulating layer such as benzocyclobutene (BCB), acrylic resin, or the like or an inorganic insulating layer such as silicon oxide, silicon nitride, or the like is deposited on an entire surface including the source/drain electrodes 47a/47b with a predetermined thickness so as to form a passivation layer 48.

After the passivation layer 48 has been selectively removed so as to form a contact hole exposing the drain electrode 47b, a pixel electrode 49 made of indium tin oxide (ITO) is formed on the passivation layer 48 so as to be connected to the drain electrode 47b through the contact hole.

Although not shown in the drawing, a black matrix is formed on a predetermined portion of a second substrate so as to prevent light leakage, a color filter layer of red (R), green (G), and blue (B) colors for realizing colors is formed between the black matrix, and then a common electrode of indium tin oxide (ITO) is formed on the color filter layer.

Finally, the first and second substrates are bonded to each other so as to face each other, liquid crystals are injected in a space several micrometers thick between the first and second substrates, and then a liquid crystal injection inlet is sealed so as to complete a liquid crystal display.

Besides, ion implantation is carried out in a direction of <220> in the above embodiment of the present invention. Furthermore, the present invention adjusts the direction of ion implantation, thereby controlling alignment of grains.

Accordingly, a method of crystallizing polysilicon, a method of fabricating a thin film transistor using the same, and a method of fabricating a liquid crystal display thereof according to the present invention have the following effects or advantages.

First, silicon ions are implanted in a particular orientation direction of grains, thereby fabricating a polysilicon layer having large grains of uniform orientation.

Second, the direction of ion implantation is suitably adjusted so as to control distribution of polycrystalline grains having uniform alignment.

Third, the increasing size of grains reduces the probability that electrons or holes are trapped on grain boundaries, thereby improving device mobility.

Fourth, a TFT or an LCD having a channel layer formed of polysilicon having large grains can improve its electron mobility, thereby being suitable for a large-sized device of high resolution.

It will be apparent to those skilled in the art than various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A polysilicon crystallizing method comprising:
    forming a polysilicon layer having a substantially uniform thickness on a substrate;
    making grains of the polysilicon layer amorphous except a portion of the grains having a specific orientation, using an implant energy sufficient to render the entire polysilicon layer amorphous; and
    crystallizing the polysilicon layer using the grains having the specific orientation;
    wherein the grains having the specific orientation are aligned in a vertical direction with respect to the substrate,
    wherein the step of crystallizing the polysilicon layer comprises growing crystals from a growth seed layer of the specific orientation direction existing in an entire lower portion of the polysilicon layer.

2. The method of claim 1, wherein forming a polysilicon layer includes micro-polysilicon.

3. The method of claim 1, wherein silicon (Si) ion implantation is carried out in making grains of the polysilicon layer amorphous.

4. The method of claim 1, wherein crystallizing comprises melting a predetermined thickness of the polysilicon layer and solidifying the melted polysilicon.

5. The method of claim 4, wherein melting a predetermined thickness of the polysilicon layer is carried out by excimer laser annealing.

6. The method of claim 1, wherein a buffer oxide layer is further formed before forming a polysilicon layer.

7. A method of fabricating a polysilicon thin film transistor, comprising:
    forming a polysilicon layer having a substantially uniform thickness on a substrate;
    making grains of the polysilicon layer amorphous except a portion of the grains having a specific orientation, using an implant energy sufficient to render the entire polysilicon layer amorphous;
    crystallizing the polysilicon layer using the grains having the specific orientation;
    patterning the polysilicon layer selectively and forming an insulating layer on an entire surface including the patterned polysilicon layer;
    forming a gate electrode on a predetermined area of the insulating layer over the polysilicon layer; and
    implanting impurities in the polysilicon layer using the gate electrode as a mask so as to form source/drain regions;
    wherein the grains having the specific orientation are aligned in a vertical direction with respect to the substrate,
    wherein the step of crystallizing the polysilicon layer comprises growing crystals from a growth seed layer of the specific orientation direction existing in an entire lower portion of the polysilicon layer.

8. The method of claim 7, wherein forming a polysilicon layer includes micro-polysilicon.

9. The method of claim 7, wherein silicon (Si) ion implantation is carried out in making grains of the polysilicon layer amorphous.

10. The method of claim 7, wherein crystallizing comprises melting a predetermined thickness of the polysilicon layer and solidifying the melted polysilicon.

11. The method of claim 10, wherein melting a predetermined thickness of the polysilicon layer is carried out by excimer laser annealing.

12. The method of claim 7, wherein a buffer oxide layer is further formed before forming the polysilicon layer.

13. A method of fabricating a liquid crystal display, comprising:
    forming a polysilicon layer having a substantially uniform thickness on a first substrate;
    making grains of the polysilicon layer amorphous except a portion of the grains having a specific orientation, using an implant energy sufficient to render the entire polysilicon layer amorphous;
    crystallizing the polysilicon layer using the grains having the specific orientation;
    patterning the polysilicon layer selectively and forming an insulating layer on an entire surface including the patterned polysilicon layer;
    forming a gate electrode on a predetermined area of the insulating layer over the polysilicon layer;
    implanting impurities in the polysilicon layer using the gate electrode as a mask so as to form source/drain regions;
    forming source/drain electrodes connected to the source/drain regions, respectively;
    forming a pixel electrode connected to the drain electrode; and
    bonding the first substrate to a second substrate so as to face each other and injecting liquid crystals in a space between the bonded first and second substrates;
    wherein the grains having the specific orientation are aligned in a vertical direction with respect to the substrate,
    wherein the step of crystallizing the polysilicon layer comprises growing crystals from a growth seed layer of the specific orientation direction existing in an entire lower portion of the polysilicon layer.

14. The method of claim 13, wherein forming a polysilicon layer includes micro-polysilicon.

15. The method of claim 13, wherein silicon (Si) ion implantation is carried out in making grains of polysilicon layer amorphous.

16. The method of claim 13, wherein crystallizing comprises melting a predetermined thickness of the polysilicon layer and solidifying the melted polysilicon.

17. The method of claim 16, wherein melting a predetermined thickness of the polysilicon layer is carried out by excimer laser annealing.

18. The method of claim 13, wherein a buffer oxide layer is further formed before forming the polysilicon layer.

19. The method of claim 13, wherein a gate line is further formed together with the gate electrode and wherein a data line crossing with the gate line is further formed together with the source/drain electrodes.

20. The method of claim 13, wherein an insulating interlayer is further formed on an entire surface including the gate electrode after the source/drain regions are formed.

21. The method of claim 13, wherein a passivation layer is further formed on an entire surface including the source/drain electrodes after the source/drain electrodes are formed.

22. The method of claim 21, wherein the passivation layer is formed of one selected from a group consisting of silicon nitride, silicon oxide, benzocyclobutene (BCB), and acrylic resin.

* * * * *